United States Patent [19]
Campanelli et al.

[11] Patent Number: 6,024,283
[45] Date of Patent: Feb. 15, 2000

[54] BAR CODE READERS HAVING SELECTABLE OPTICAL ELEMENTS

[75] Inventors: Joseph Campanelli, Centereach; Paul Dvorkis, Stony Brook; Boris Metlitsky, Centereach; Daniel R. McGlynn, Brooklynn, all of N.Y.

[73] Assignee: Symbol Technologies, Inc., Holtsville, N.Y.

[21] Appl. No.: 08/999,956

[22] Filed: Sep. 17, 1997

Related U.S. Application Data

[63] Continuation of application No. 08/394,813, Feb. 27, 1995, abandoned.

[51] Int. Cl.[7] ................................................ G06K 7/10
[52] U.S. Cl. ............................ 235/462.32; 235/462.41
[58] Field of Search ...................... 235/455, 467, 235/462, 472, 462.22, 462.32, 462.41; 250/205; 359/72

[56] References Cited

U.S. PATENT DOCUMENTS

| | | | |
|---|---|---|---|
| 3,986,022 | 10/1976 | Hyatt | 250/205 |
| 4,251,798 | 2/1981 | Swartz et al. | |
| 4,342,906 | 8/1982 | Hyatt | 250/205 |
| 4,369,361 | 1/1983 | Swartz et al. | |
| 4,387,297 | 6/1983 | Swartz et al. | |
| 4,409,470 | 10/1983 | Shepard et al. | |
| 4,441,791 | 4/1984 | Hornbeck | 350/360 |
| 4,760,248 | 7/1988 | Swartz et al. | |
| 4,818,886 | 4/1989 | Drucker | 235/462 X |
| 4,896,026 | 1/1990 | Krichever et al. | |
| 4,963,756 | 10/1990 | Quan et al. | 235/462 X |
| 5,010,241 | 4/1991 | Butterworth | 235/462 |
| 5,071,229 | 12/1991 | Oaki et al. | 359/53 |
| 5,083,857 | 1/1992 | Hornbeck | 359/291 |
| 5,144,120 | 9/1992 | Krichever et al. | |
| 5,210,398 | 5/1993 | Metlitsky | 235/462 |
| 5,256,269 | 10/1993 | Sova | |
| 5,258,605 | 11/1993 | Metlitsky et al. | 235/462 |
| 5,266,794 | 11/1993 | Olbright et al. | 250/214 LS |
| 5,283,447 | 2/1994 | Olbright et al. | 257/85 |
| 5,285,466 | 2/1994 | Tabatabaie | 372/50 |
| 5,308,966 | 5/1994 | Danielson et al. | 235/455 X |
| 5,319,496 | 6/1994 | Jewell et al. | 359/741 |
| 5,326,386 | 7/1994 | Lee et al. | |
| 5,345,336 | 9/1994 | Aoyama et al. | 235/628 |
| 5,350,909 | 9/1994 | Powell et al. | 235/472 |
| 5,467,204 | 11/1995 | Hatano et al. | 359/72 X |
| 5,525,810 | 6/1996 | Jewell et al. | 250/566 |
| 5,530,233 | 6/1996 | Krichever et al. | 235/440 |
| 5,663,549 | 9/1997 | Katz | |
| 5,745,152 | 4/1998 | Vincent et al. | |
| 5,770,847 | 6/1998 | Olmstead | 235/454 |
| 5,814,827 | 9/1998 | Katz | |

FOREIGN PATENT DOCUMENTS

| | | | |
|---|---|---|---|
| WO 94/19765 | 9/1994 | European Pat. Off. | |
| 59-156219 | 9/1984 | Japan | |
| 63-184178 | 7/1988 | Japan | 235/462 |
| 63-198177 | 8/1988 | Japan | 235/470 |

OTHER PUBLICATIONS

Schneider et al., "Efficient Room–Temperature Continuous–Wave AlGaInP/AlGaAs Visible (670 nm) Vertical–Cavity Surface–Emitting Laser Diodes," IEEE Photonics Technology Letters, vol. 6, No. 3, pp. 313–316, (1994).

"IBM, TI announce better ways to manipulate light signals," The Institute of Electrical and Electronics Engineeers, Inc., vol. 13, No. 11, (1989).

*Primary Examiner*—Donald Hajec
*Assistant Examiner*—Mark Tremblay
*Attorney, Agent, or Firm*—Finnegan, Henderson, Farabow, Garrett & Dunner, L.L.P.

[57] ABSTRACT

A bar code reader for reading a symbol located at a distance from the laser comprises an array of groups of reading elements and an array of selectable liquid crystal elements. Each of the groups of reading elements have an associated predetermined operating focal distance. At least one liquid crystal element corresponds to each group of reading elements. In the bar code reader, a device activates a selected liquid crystal element to transmit light to a selected group of reading elements. In this way, the reading elements can operate at a predetermined, fixed operating focal distance.

34 Claims, 4 Drawing Sheets

BAR CODE READERS HAVING SELECTABLE OPTICAL ELEMENTS

REFERENCE TO RELATED APPLICATIONS

This application is a continuation of application Ser. No. 08/394,813 filed Feb. 27, 1995, now abandoned. This application is related to U.S. patent application Ser. No. 08/111,532, filed Aug. 25, 1993, and to U.S. patent application Ser. No. 08/098,991, filed Jul. 29, 1993, which is a divisional of Ser. No. 07/864,367, filed Apr. 6, 1992, now U.S. Pat. No. 5,258,605, which is a continuation of Ser. No. 07/493,134 filed Mar. 13, 1990.

BACKGROUND OF THE INVENTION

1. Field of the Invention

This invention generally relates to an apparatus and method operative for electro-optically reading indicia having parts of different light reflectivity, for example, bar code or matrix array symbols, and, more particularly, to devices employing a vertical cavity surface emitting laser (VCSEL) diodes.

2. Description of the Related Art

Various optical readers and optical scanning systems have been developed heretofore for reading indicia such as bar code symbols appearing on a label or on the surface of an article. The bar code symbol itself is a coded pattern of indicia comprised of a series of bars of various widths spaced apart from one another to bound spaces of various widths, the bars and spaces having different light reflecting characteristics. The readers in scanning systems electro-optically transform the graphic indicia into electrical signals, which are decoded into alphanumeric characters that are intended to be descriptive of the article or some characteristic thereof. Such characteristics are typically represented in digital form and utilized as an input to a data processing system for applications in point-of-sale processing, inventory control and the like. Scanning systems of this general type have been disclosed, for example, in U.S. Pat. Nos. 4,251,798; 4,369,361; 4,387,297; 4,409,470; 4,760,248; and 4,896,026, all of which have been assigned to the same assignee as the instant application. As disclosed in some of the above patents, one embodiment of such a scanning system resides, inter alia, in a hand held, portable laser scanning device supported by a user, which is configured to allow the user to aim the scanning head of the device, and more particularly, a light beam, at a targeted symbol to be read.

The light source in a laser scanner bar code reader is typically a gas laser or semiconductor laser. The use of semiconductor devices as the light source is especially desirable because of their small size, low cost and low voltage requirements. The laser beam is optically modified, typically by an optical assembly, to form a beam spot of a certain size at the target distance. It is preferred that the cross section of the beam spot at the target distance be approximately the same as the minimum width between regions of different light reflectivity, i.e., the bars and spaces of the symbol. At least one bar code reader has been proposed with two light sources to produce two light beams of different frequency.

One laser-based bar code scanner relevant to the present invention is disclosed in U.S. Pat. No. 5,144,120 to Krichever et al. (and U.S. patent application Ser. No. 08/181,925, now U.S. Pat. No. 5,401,948 which employs laser, optical and sensor components in conjunction with a mirrorless scanner arrangement. One or more of these components are mounted on a drive for repetitive reciprocating motion either about an axis or in a plane to effect scanning.

Another proposed bar code scanner employs electronic means for causing the light beam to scan a bar code symbol, rather than using a mechanical device. A linear array of light sources activated one at a time in a regular sequence may be imaged upon the bar code symbol to simulate a scanned beam. Instead of a single linear array of light sources, a multiple-line array may be employed, producing multiple scan lines. Such a scanner is disclosed in U.S. Pat. No. 5,258,605 to Metlitsky et al.

Typically, the semiconductor lasers used in such bar code scanners is an edge-emitting injection laser in which the laser beam is emitted from the p-n junction region on a polished end face of the device.

By their physical nature, these known edge-emitting injection lasers emit a beam from a thin region at the p-n junction. Thus, for a given power output there is only a relatively small area from which generated heat must be dissipated. Furthermore, a laser beam emanating from a thin source has a large beam divergence which makes focusing difficult and results in a wide range of variability in performance from laser to laser.

A more recently developed form of semiconductor laser is the vertical-cavity surface-emitting laser diode (VCSEL), such as described in "Efficient Room-Temperature Continuous-Wave AlGaInP/AlGaAs Visible (670 nm) Vertical-Cavity Surface Emitting Laser Diodes" by R. P. Schneider et al. published in IEEE Photonics Technology Letters, Vol. 6, No. 3, March 1994. Reference is also made to U.S. Pat. Nos. 5,283,447; 5,285,466; 5,266,794; 5,319,496; and 5,326,386, which are hereby incorporated by reference, for background information.

The VCSEL has a substantial surface area from which the laser beam is emitted. Thus, the beam produced is less divergent in one dimension than with known edge-emitting type semiconductor laser diodes. The output beam is round, and is virtually not astigmatic. Furthermore, VCSELs typically operate at significantly lower currents than edge-emitting laser diodes. Therefore, it also generates less heat.

In the laser beam scanning systems known in the art, a single laser light beam is directed by a lens or other optical components along the light path toward a target that includes a bar code symbol on the surface. The moving-beam scanner operates by repetitively scanning the light beam in a line or series of lines across the symbol by means of motion of a scanning component, such as the light source itself or a mirror disposed in the path of the light beam. The scanning component may either sweep the beam spot across the symbol and trace a scan line across the pattern of the symbol, or scan the field of view of the scanner, or do both.

Bar code reading systems also include a sensor or photodetector which detects light reflected or scattered from the symbol. The photodetector or sensor is positioned in the scanner in an optical path so that it has a field of view which ensures the capture of a portion of the light which is reflected or scattered off the symbol, detected, and converted into an electrical signal. Electronic circuitry and software decode the electrical signal into a digital representation of the data represented by the symbol that has been scanned. For example, the analog electrical signal generated by the photodetector is converted by a digitizer into a pulse or modulated digitized signal, with the widths corresponding to the physical widths of the bars and spaces. Such a digitized signal is then decoded, based on the specific symbology used by the symbol, into a binary representation of the data encoded in the symbol, and subsequently to the alpha numeric characters so represented.

The decoding process of known bar code reading system usually works in the following way. The decoder receives the pulse width modulated digitized signal from the digitizer, and an algorithm, implemented in the software, attempts to decode the scan. If the start and stop characters and the characters between them in the scan were decoded successfully and completely, the decoding process terminates and an indicator of a successful read (such as a green light and/or an audible beep) is provided to the user. Otherwise, the decoder receives the next scan, performs another decode attempt on that scan, and so on, until a completely decoded scan is achieved or no more scans are available.

Such a signal is then decoded according to the specific symbology into a binary representation of the data encoded in the symbol, and to the alphanumeric characters so represented.

Moving-beam laser scanners are not the only type of optical instrument capable of reading bar code symbols. Another type of bar code reader is one which incorporates detectors based on solid state imaging arrays or charge coupled device (CCD) technology. In such prior art readers the sides of the detector are typically smaller than the symbol to be read because of the image reduction by the objective lens in front of the array or CCD. The entire symbol is flooded with light from a light source such as lighting light emitting diodes (LED) in the scanning device, and each cell in the array is sequentially read out to determine the presence of a bar or a space in the field of view of that cell.

The working range of CCD bar code scanners is rather limited as compared to laser-based scanners and is especially low for CCD based scanners with an LED illumination source. Other features of CCD based bar code scanners are set forth in U.S. patent application Ser. No. 08/041,281, now U.S. Pat. No. 5,396,054 which is hereby incorporated by reference, and in U.S. Pat. No. 5,210,398. These references are illustrative of the certain technological techniques proposed for use in CCD type scanners to acquire and read indicia in which information is arranged in a two dimensional pattern.

SUMMARY OF THE INVENTION

1. Objects of the Invention

It is a general object of the invention to provide a laser scanner for bar code reading implemented on a semiconductor substrate.

It is another object of the present invention to mount light emitting and detecting elements on a miniature frame assembly capable of motion for effecting a scanning pattern.

It is still another object of the present invention to provide an array of lenses and/or an array of liquid crystal shutter elements adjacent to a semiconductor substrate that includes an array of light emitting and/or detecting elements.

It is yet another object of the present invention to provide an illumination light source for a bar code reader using a vertical cavity surface emitting laser diode.

It is still another object to enable auto alignment (i.e., do away with the focusing step in a manufacturing process) by using VCSEL arrays to achieve multiple focus.

2. Features of the Invention

In keeping with these objects, and others which will become apparent hereinafter, one feature of this invention resides, briefly stated, in an integrated electro-optical system for reading indicia having parts of different light reflectivity, e.g. bar code symbols having alternating bars and spaces.

In accordance with one feature of this invention, a method of reading indicia such as a bar code symbol by illuminating a field containing the indicia with a sequence of light spots by sequentially activating a plurality of separate light sources which are disposed on a semiconductor substrate; and detecting light reflected from the field to produce an electrical signal representing light of variable intensity reflected off the indicia.

The present invention further provides a bar code reader for reading such indicia, including a light source component for emitting one or more light beams; a light directing component for directing the light beam along a path toward the indicia; and a stationary photodetector component having a field of view and operative for detecting at least a portion of the light of variable intensity reflected off the indicia. An optical arrangement is provided which functions to provide a series of independent scans of the indicia, each scan representing a different focal plane disposed exteriorly to the reader.

In accordance with the teachings herein, the present invention provides a laser scanning device comprising a vertical-cavity, surface-emitting laser, mounted on a substrate and arranged to produce a multiple laser beam output, a scanning arrangement for effecting scanning by the laser beam, an optical arrangement for focusing the output on a target to be scanned, and a sensor for detecting the reflected light from the target.

The surface area of a VCSEL can usefully be used to support an optical component, such as a diffractive or refractive lens, directly in front of the diode surface. Mounting of the optical component may conveniently be effected during fabrication to achieve desired focusing. The laser may be operated only for short bursts in scanner applications, further reducing the power consumption of the VCSEL. As a result, the substrate for the VCSEL is likely to provide sufficient heat dissipation such that further head sinking of the laser is not required.

In one particular form of the invention, a phased array of lasers can be arranged in groups that define focused scanning beams at differing positions. Alternatively, scanning may be done electronically by actuating a phased array of laser diodes to create the effect of a single scanning beam. These may be actuated selectively or in a predetermined automatic sequence. Thus, a multiline scan may be produced, or the beam for two or more lasers may be developed to produce a beam spot of a given shape on a predetermined target plane, if that is the system requirement.

Scanning may also be effected by physically moving the laser about a field point or points. In both cases, therefore, especially in that of the phased array of lasers, the lower power consumption of the VCSEL is advantageous over prior art devices.

The novel features which are considered as characteristic of the invention are set forth in particular in the appended claims. The invention itself, however, both as to its construction and its method of operation, together with additional objects and advantages thereof, best will be understood from the following description of specific embodiments when read in connection with the accompanying drawings.

BRIEF DESCRIPTION OF THE DRAWINGS

The foregoing objects and advantages of the present invention for a scanner may be more readily understood by one skilled in the art with reference being had to the following detailed description of preferred embodiments thereof, taken in conjunction with the accompanying drawings in which.

DETAILED DESCRIPTION OF THE PREFERRED EMBODIMENTS

Figure 1:
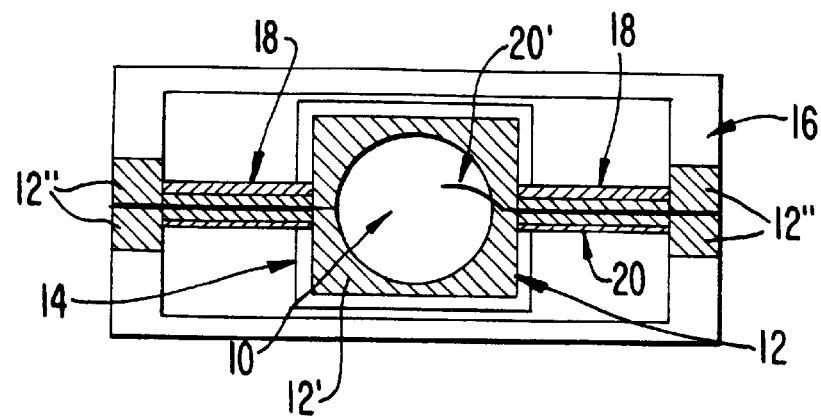
FIG. 1 illustrates a front plan view of a VCSEL and detector mounted on a torsional micromachined mirror.

Referring now to the drawings there is shown a bar code reader of the type generally described in the above identified patents and patent applications, the entire contents of which are all hereby incorporated by reference herein, for reading bar code symbols, such as UPC bar code symbols. As used in this specification and the following claims, the term "symbol" is intended to be broadly construed and to cover not only symbol patterns composed of alternating bars and spaces, but also other patterns, as well as alphanumeric characters and, in short, any indicia having portions of different light reflectivity.

Referring more particularly to the first embodiment of the present invention, and to FIG. 1 of the drawing, there is illustrated a top plan view of device structure according to the present invention including an integrated GaAlAs VCSEL laser diode device 10 mounted on a silicon substrate 12, the device and substrate being collectively referred to herein as "the laser arrangement 14." The laser arrangement 14 is suspended within a miniature frame assembly 16 by a pair of TiNi torsional hinges 18 which are each secured to the substrate 12 and to a respective opposing face of the frame 16.

Electrical contacts 20, 20' pass along each hinge 18. One contact 20 is connected to the laser diode 10, providing power from a remote source.

The active area of the VCSEL is well protected by its less sensitive surfaces and it is possible to wafer-bond the substrate 12 with the device 10. The unwanted semiconductor areas (both Si and GaAlAs) can then be etched away in order to define the center isle.

While the device of FIG. 1 is illustrated as being suspended in the frame by a torsional hinge on either side, the invention could equally be implemented in the form of a cantilever structure as well. The actuation mechanism for physically moving the device can be electrostatic, bimetallic, shape memory, piezo-electric, magnetic or any other known form by which sufficient movement can be imparted in a sufficiently smooth and appropriate way. Reference may be made to U.S. patent application Ser. No. 08/141,342, filed Oct. 25, 1993, hereby incorporated by reference, to illustrate various miniaturized movable assemblies. It can also be mounted on more conventional and taut band elements, mylar or other moving substrates. A lens can be provided on top of the VCSEL for focusing. The lens can be diffractive optics and be "wafer bonded" to the VCSEL.

Figure 2:
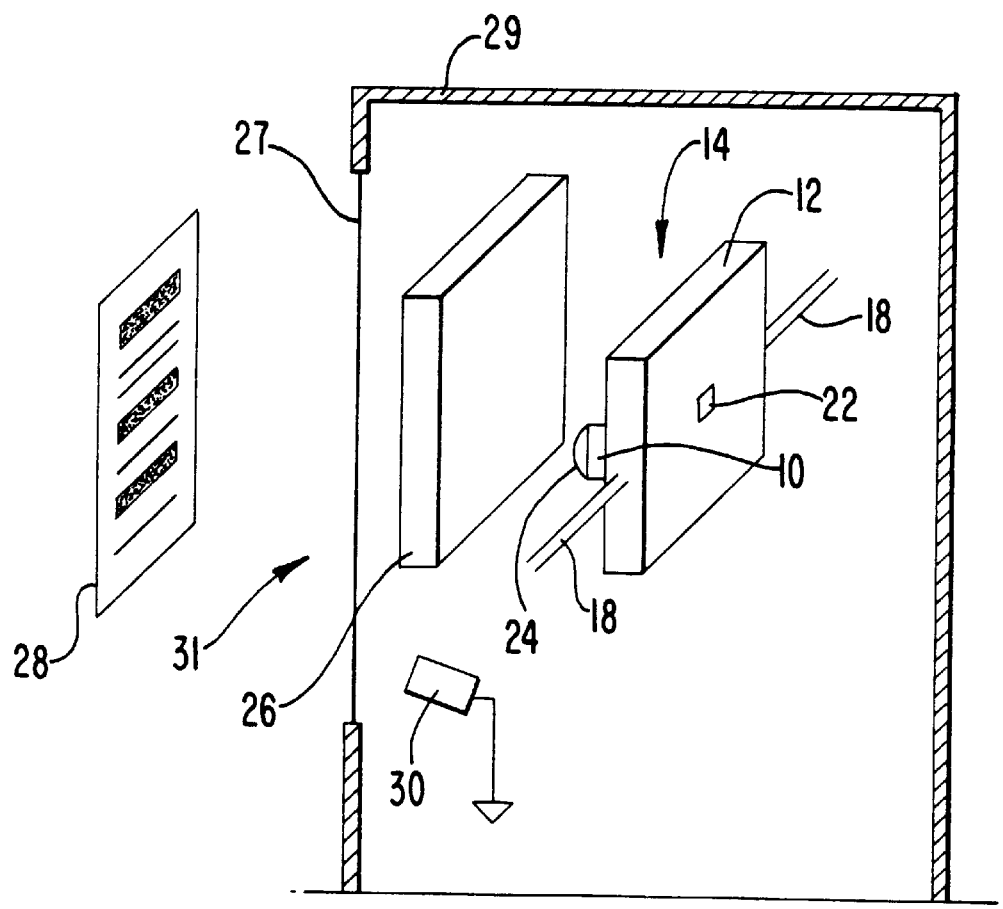
FIG. 2 illustrates an embodiment of a bar code scanner system according to the invention.

Referring now to FIG. 2, which shows the laser arrangement 14 of FIG. 1 located in a housing 29 of a bar code reader 31, the laser diode 10 produces a diverging light beam which is collimated by a lens array 24 mounted directly on or closely adjacent to the emitting surface of the device. A diffuser 26 could be used in the path of the collimated beam in the embodiment in which the VCSEL is to produce uniform illumination. Diffusion may also be carried out without any collimation. If one nears the beam, it is preferably collimated and not diffused. If the beam is diffused, then it is used only to illuminate the target and we need a CCD array for diffusion.

The laser light beam output, either collimated or diffused, passes through a window 27 in the housing 29 of the scanner apparatus 31 and is incident upon a target 28 including a bar code symbol to be read. The laser arrangement 14 is rotated about its torsional hinges 18 which produces a linear motion of the static light beam which scans the bar code symbol 28. Light reflected from the bar code is detected by a photodetector 30, and the variation in intensity of the detected light is then digitized and applied to a decoder of conventional arrangement. Typical movement of the laser arrangement 14 will sweep an included angle of about 40° to perform the scan.

By using a VCSEL to illuminate the bar code target, an illuminating light source is realized with significantly less heat generated than in prior art devices. In this case, the beam is not scanned, but the receiver will be either a CCD or CMOS detector array.

While the bar code reader 31 is depicted in FIG. 3 as a fixed installation it may, in other embodiments, take other various forms. For example, it could be embodied as a trigger-operated scanning gun such as will be described in FIG. 4.

Referring back to FIG. 1, in addition to the VCSEL being integrated on the surface of substrate 12, which acts as a "scanning mirror," the remaining portion of the mirror 12' and frame 12" can be made into a photodetector sensor element or array. The photodetector on the mirror is of the retroreflective type, since the mirror is always turning in the direction of the scan beam. The detectors 12" on the frame are stationary, and of the non-retroreflective type. The frame area can be increased by filling in the empty spaces near the torsional hinges that support the mirror.

Figure 3A:
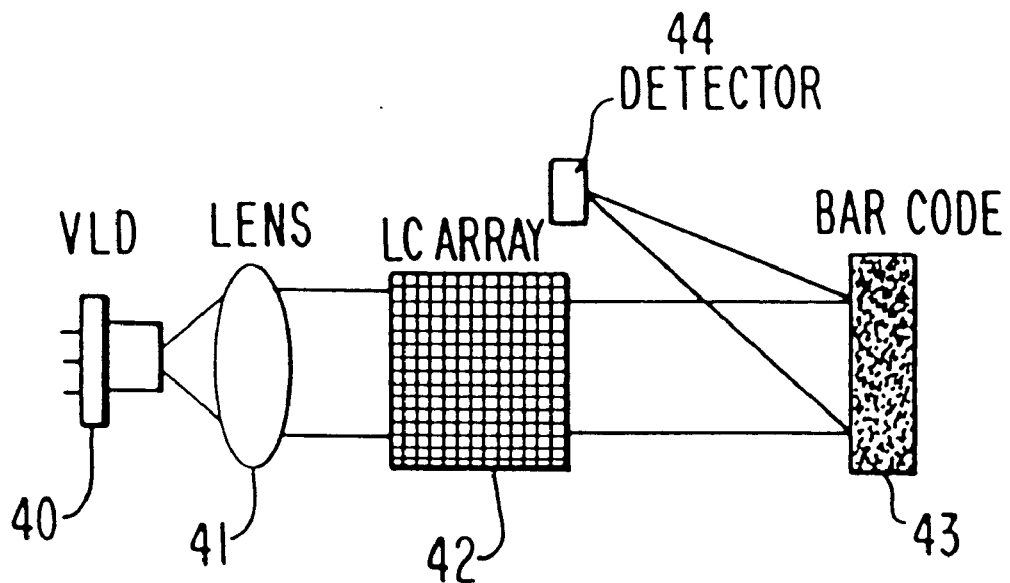
FIGS. 3a–3c illustrate alternative embodiments of a bar code scanner system according to the invention.
Figure 3B:
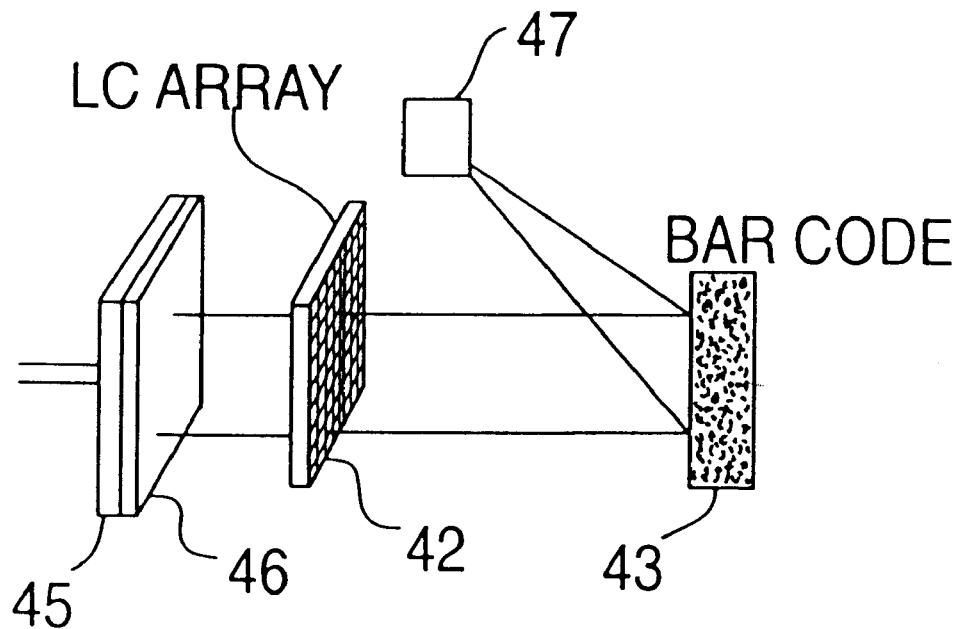
Figure 3C:
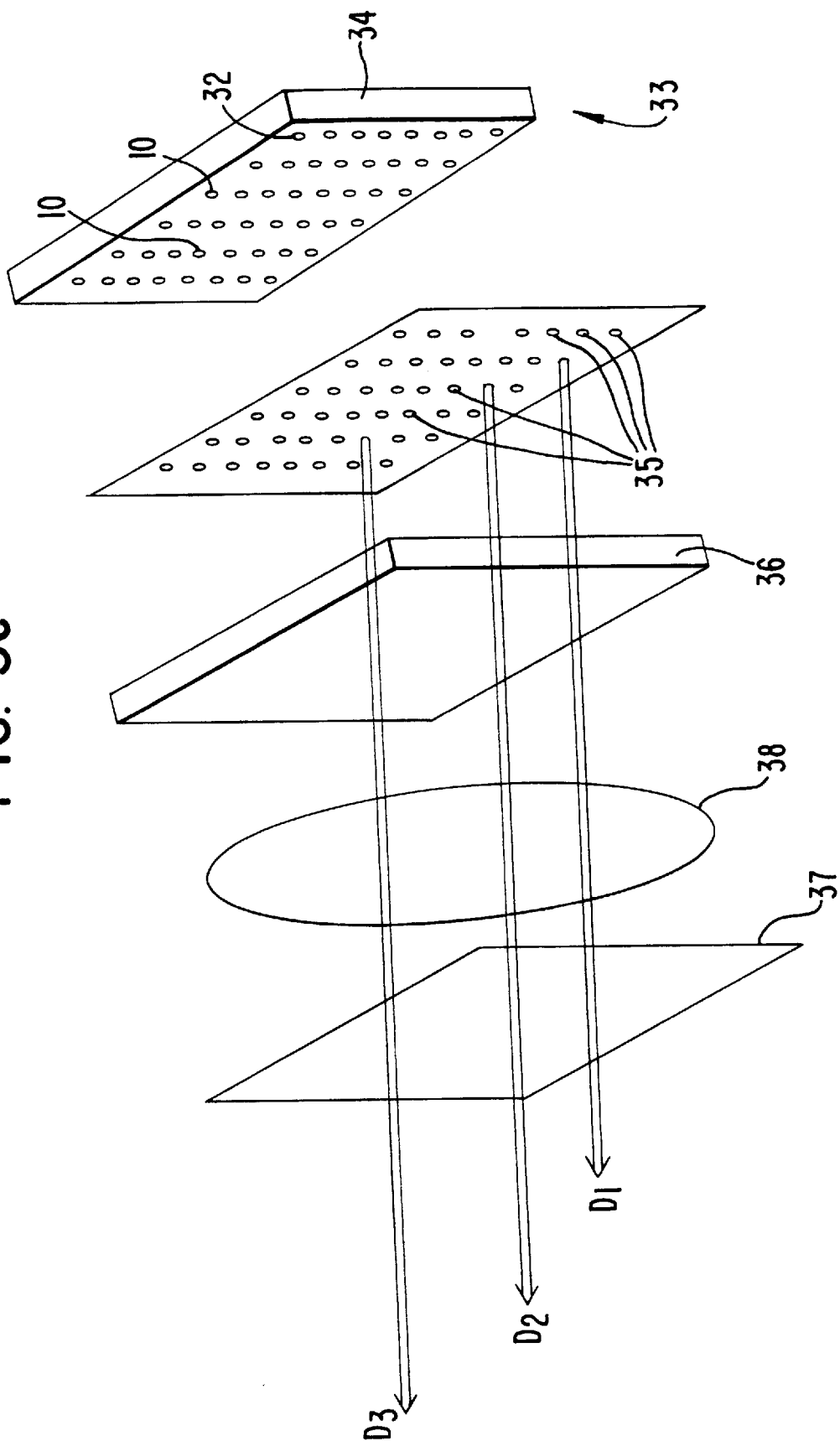

Referring next to FIGS. 3a, 3b and 3c, alternative forms and embodiments of the invention are shown. FIG. 3a illustrates the combination of a laser diode 40, which may be a VCSEL array, together with a suitable lens 41, for collimating or focusing the light emitted from the laser diode 40, and a liquid crystal array 42. It is generally known, for example from U.S. Pat. No. 5,071,229, to provide a variable focal length lens constructed of a material having the electro-optic effect such as liquid crystals, liquid crystal polymer, PLZT, etc., light blocking means variable in aperture size, and in general means for changing the focal length of the variable focal length lens in synchronization with variations of the aperture size of the light blocking means. Thus, it is known that the brightness of visual field and the depth of field according to the focusing and the distance to the object can be controlled with a liquid crystal device. An electromagnetic stop apparatus such as a liquid crystal stop has been proposed in the prior art to interlock the focusing adjustment of the imaging lens with the variation of the stop diameter of the imaging lens by the combination with the variable focusing lens such as a liquid crystal lens. A conventional example of the electro-optic stop apparatus is described in Japanese Publication No. Sho 59-156219.

The present invention may also utilize the LC array 42 to perform scanning of the bar code symbol 43 by means of sequentially, selectively activating individual elements of the LC array 42 to direct the light emitted from the lens 41 into a predetermined pattern so as to form a path on the target symbol 43. The light reflected from the symbol will be detected by a discrete sensor 44, as is conventional in prior art bar code reading systems. Reference here is made to U.S. Pat. No. 5,258,605 hereby incorporated by reference, and in particular FIG. 20 therein.

An alternative embodiment shown in FIG. 3b utilizes a light source 47 to illuminate the bar code symbol 43. The LC array 42 is now operative in connection with a detector array 45 which images a field of view, so that the LC array selects and defines the portion of the field of view which is imaged upon the array 45. A corresponding array 46 of focusing lens, such as the array illustrated in U.S. Pat. No. 5,345,336, may be used in connection with the array so that specific detector elements in the array 45 are associated with a lens element of a specific optical characteristic (e.g., focal length, aperture, polarization, filtering, etc.). The matching of detector elements and lens elements may be used to more accurately image the symbol 43 on the array 45 in circumstances when the symbol 43 is situated at an arbitrary or unknown distance from the array, or the plane of the symbol is positioned in a skewed manner with respect to the plane of the array.

Thus, this embodiment of the present invention provides a bar code reader for reading a symbol located at a distance from the reader, including an array of groups of reading elements, each group having an associated predetermined operating focal distance; an array of selectable liquid crystal elements disposed adjacent to the array of reading elements, at least one liquid crystal element corresponding to each group of reading elements; and means for activating a selected liquid crystal element as so to select a corresponding group of reading elements for transmitting light through corresponding selected element, whereby the reader is operated at a predetermined selected operating focal distance.

In lieu of using a liquid crystal matrix, as shown in FIGS. 3a and 3b, it is also possible to use an array of miniature mirrors in its place in the path of the outgoing or incoming light beam, such as described in the parent application to the present application. By selectively activating individual rows of such mirrors (or predetermined ones of such mirrors in a sequential pattern), one can "select" either specific light source elements (such as in a VCSEL array of light sources) or detector elements (such as in the array 45) depending upon the type of scanning pattern (or field of view imaging) one wishes to implement. Deformable mirror devices, (hereinafter "DMDs") such as those of Texas Instruments as described in the article "IBM, TI Announce Better Ways to Manipulate Light Signals," IEEE Institute, November 1989, Vol. 13, No. 11 may also be used in place of, or in addition to, the liquid crystal matrix. See also U.S. Pat. Nos. 5,256, 269, 5,083,857 and 4,441,791. As noted in such references, DMDs depend on the same sort of address circuitry as dynamic RAMs to access an array of electrodes, which lie on the chip's surface and control the mirror pixel elements poised above them. DMDs also have both analog and digital capability. For an analog application, applying charge to one of the two address electrodes rotates a mirror pixel in that direction; increasing the voltage increases the angle the mirror rotates. The applications envisioned here employ full rotation in one direction or the other.

FIG. 3c is an enlarged view of still another embodiment of the invention similar to that of FIG. 3a. FIG. 3c shows a two-dimensional array 33 of VCSEL lasers 10 arranged in rows and columns 32 and disposed in a common substrate 34. An array of lenses 35 are similarly arranged in the path of the output of the device. While the array of lenses 35 is shown remote from the VCSEL in FIG. 3c, they may also be advantageously mounted directly on the laser beam emitting substrate as in FIG. 2. Reference may be made to U.S. Pat. No. 5,345,336 as an example of one implementation depicting a lens array disposed closely adjacent to a semiconductor light source. Another lens 38 is disposed in the beam path to focus each individual beam at different distances $D_1$, $D_2$ and $D_3$, for example.

In this embodiment, there is no physical movement of the device to effect scanning, but in other embodiments an array may be located on a moving substrate. In FIG. 3, the effect of scanning is created by sequential excitation of the VCSELs 10 in the columns of the array. By this sequential excitation the equivalent of a single scanning beam is created such that a bar code 37 is swept in order for a detector 38 to be able to pick up the variations in intensity of light reflected therefrom for decoding in the conventional way.

The invention may be carried out with various types of VCSEL devices, those incorporating II–VI or more especially III–V Group compound semiconductor materials layers are preferred.

The array of lenses 35 is, in one embodiment, arranged to provide a single scanning beam effect with one plane of focus. However, the array of lenses 35 can also be designed to create a sequence of beams being focused at different planes. In this case the focal plane of interest could be selected manually or be part of an automatic sequence, which repeats until the decoding apparatus acknowledges receipt of successfully decoded information. Thus, the present invention also provides a bar code reader for reading a symbol located at a distance from the reader, comprising an array of groups of reading elements, each group having an associated predetermined operating focal distance; an array of selectable liquid crystal or DMD elements disposed adjacent to said array of reading elements, at least one liquid crystal or DMD element corresponding to each group of reading elements; and means for activating a selected liquid crystal or DMD element so as to select a corresponding group of reading elements for transmitting light through corresponding selected element whereby the reader is operated at a predetermined selected operating focal distance.

Of course, the present invention can be made to work equally well with light emitted at wavelengths in the visible or in the infra-red range.

Figure 4:
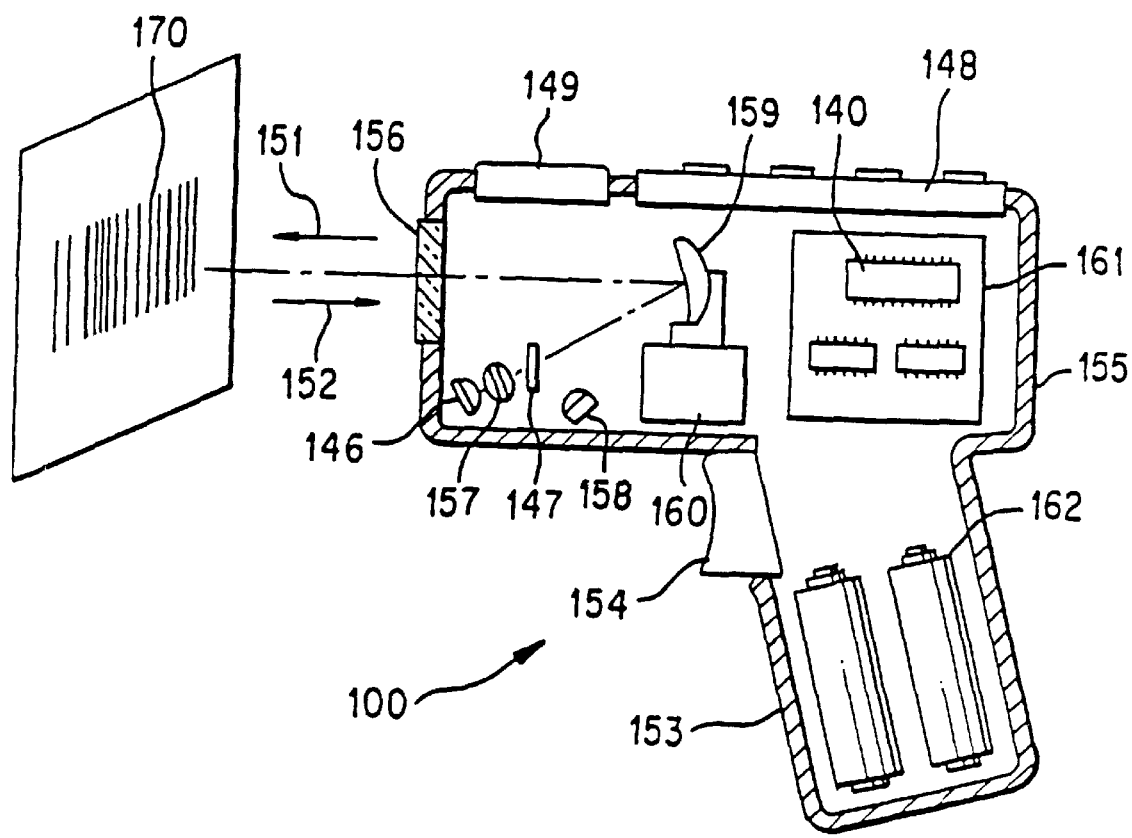
FIG. 4 illustrates a hand-held bar code reader incorporating the device of the present invention.

In a CCD reader, for example, employing an optical bandpass filter before the detector can reduce the ambient light reaching the detector. The combination of the filter and the high power output from the lasers (resulting in very good target illumination) can significantly increase the working range of such detectors, which is especially important for imaging types of detectors. FIG. 4 illustrates a highly simplified embodiment of one type of bar code reader that may utilize the integrated electro-optical device of the present invention. A reader 100 may be implemented in a hand-held scanner, as illustrated, or a desk-top workstation of stationary scanner. In a preferred embodiment, the arrangement is implemented in a housing 155 that includes an exit port 156 through which an outgoing laser light beam 151 is directed to impinge on, and to be scanned across, symbols 170 located exteriorly of the housing.

The hand-held device of FIG. 4 is generally of the style disclosed in U.S. Pat. No. 4,760,248 issued by Swartz et al., or in U.S. Pat. No. 4,896,026 assigned to Symbol Technologies, Inc. and also similar to the configuration of a bar code reader commercially available as part number LS 8100, LS 2000 or LS 3000 from Symbol Technologies, Inc.

Alternatively, or in addition, features of U.S. Pat. No. 4,387,297 issued to Swartz et al. or U.S. Pat. No. 4,409,470 issued to Shepard et al., both patents assigned to Symbol Technologies, Inc., may be employed in constructing the bar code reader unit of FIG. 5. These U.S. Pat. Nos. 4,760,248, 4,896,026, and 4,409,470 are incorporated herein by reference, but the general design of such devices will briefly be described here for reference.

Referring to FIG. 4 in more detail, an outgoing light beam 151 is generated in the reader 100, usually by an electro-optic device of the present invention, and directed to impinge upon a bar code symbol disposed on a target a few inches from the front of the reader unit. The outgoing beam 151 is scanned in a scan pattern, and the user positions the hand-held unit so this scan pattern traverses the symbol to be read. Reflected and/or scattered light 152 from the symbol is detected by a light-responsive device 158 in the reader unit, producing serial electrical signals to be processed and decoded for reproducing the data represented by the bar code. As used hereinafter, the term "reflected light" shall mean reflected and/or scattered light.

In a preferred embodiment, the reader unit 100 is a gun shaped device having a pistol-grip type of handle 153. A movable trigger 154 is employed to allow the user to activate the light beam 151 and detector circuitry when the user has positioned the device to point at the symbol to be read. A lightweight plastic housing 155 contains the laser light source 146, the detector 158, the optics 157, 147, 159, and signal processing circuitry including a CPU 140 as well as power source or battery 162. A light-transmissive window 156 in the front end of the housing 155 allows the outgoing light beam 151 to exit and the incoming reflected light 152 to enter. The reader 100 is designed to be aimed at a bar code symbol spaced from the symbol, i.e., not touching the symbol or moving across the symbol. Typically, this type of hand-held bar code reader is specified to operate in the range of perhaps several inches.

The reader 100 may also function as a portable computer terminal, and include a keyboard 148 and a display 149, such as described in the previously noted U.S. Pat. No. 4,409,470.

Although the present invention has been described with respect to reading one or two dimensional bar codes, it is not limited to such embodiments, but may also be applicable to more complex indicia scanning applications. It is conceivable that the method of the present invention may also find application for use with various machine vision or optical character recognition applications in which information is derived from other types of indicia such as characters or from the surface characteristics of the article being scanned.

In all of the various embodiments, the elements of the scanner may be assembled into a very compact package that allows the entire scanner to be fabricated as a single printed circuit board of integral module. Such a module can interchangeably be used as the laser scanning element for a variety of different types of data acquisition systems. For example, the module may be alternately used in a hand-held scanner, a table top scanner attached to a flexible arm or mounting extending over the surface of the table or attached to the underside of the table top, or mounted as a subcomponent or subassembly of a more sophisticated data acquisition system. Control or data lines associated with such components may be connected to an electrical connector mounted on the edge or external surface of the module to enable the module to be electrically connected to a mating connector associated with other elements of data acquisition system.

An individual module may have specific scanning or decoding characteristics associated with it, e.g. operability at a certain working distance, or operability with a specific symbology or printing density. The characteristics may also be defined through the manual setting of control switches associated with the module. The user may also adapt the data acquisition system to scan different types of articles or the system may be adapted for different applications by interchanging modules on the data acquisition system through the use of the simple electrical connector.

The scanning module described above may also be implemented within a self-contained data acquisition system including one or more such components as keyboard, display, printer, data storage, application software, and data bases. Such a system may also include a communications interface to permit the data acquisition system to communicate with other components of a local area network or with the telephone exchange network, either through a modem or an ISDN interface, or by low power radio broadcast from the portable terminal to a stationary receiver.

It will be understood that each of the features described above, or two or more together, may find a useful application in other types of scanners and bar code readers differing from the types described above.

While the invention has been illustrated and described as embodied in it is not intended to be limited to the details shown, since various modifications and structural changes may be made without departing in any way from the spirit of the present invention.

Without further analysis, the foregoing will so fully reveal the gist of the present invention that others can readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed is:

1. A bar code reader for reading a bar code symbol, comprising:
   an array of detector elements;
   an array of selectable optical elements disposed proximate to the array of detector elements, wherein the optical elements correspond to the detector elements;
   an array of focusing lenses positioned between the array of selectable optical elements and the array of detector elements; and
   means for selecting an optical element to cause at least one of the corresponding detector elements associated with the optical element to receive light reflected from the bar code symbol in focus.

2. A bar code reader for reading a bar code symbol according to claim 1, wherein said means for selecting selects based upon a distance between the bar code symbol and the detector elements.

3. The bar code reader according to claim 1, wherein the array of focusing lenses is attached to the array of detector elements.

4. The bar code reader according to claim 1, wherein the optical elements selectively transmit light.

5. The bar code reader according to claim 4, wherein the optical elements are liquid crystal elements.

6. The bar code reader according to claim 1, wherein the optical elements selectively reflect light.

7. The bar code reader according to claim 6, wherein the optical elements are miniature mirror elements.

8. The bar code reader according to claim 1, wherein the means for selecting causes the detector elements to receive light such that less than the entire bar code symbol is detected at one time.

9. The bar code reader according to claim 1, wherein the means for selecting causes the detector elements to receive light such that the entire bar code symbol is detected at one time.

10. The bar code reader according to claim 1, further comprising a light source for emitting a light beam onto the bar code symbol.

11. The bar code reader according to claim 1, wherein the array of optical elements is disposed in a fixed relation with respect to the array of detector elements.

12. The bar code reader according to claim 1, wherein the detector elements are charge coupled devices.

13. A bar code reader for reading a bar code symbol, comprising:
- an array of detector elements;
- an array of selectable liquid crystal elements optically coupled to the array of detector elements, wherein the liquid crystal elements correspond to the detector elements;
- an array of focusing lenses disposed adjacent to the array of detector elements, wherein each focusing lens corresponds to at least one detector element; and
- means for selecting a liquid crystal element to cause at least one of the corresponding detector elements associated with the liquid crystal element to receive light reflected from the bar code symbol in focus.

14. A bar code reader for reading a bar code symbol according to claim 13, wherein said means for selecting selects based upon a distance between the bar code symbol and the detector elements.

15. The bar code reader according to claim 13, wherein the array of focusing lenses is attached to the array of detector elements.

16. The bar code reader according to claim 13, further comprising an array of miniature mirrors disposed adjacent to the array of liquid crystal elements.

17. The bar code reader according to claim 13, wherein the means for selecting causes the detector elements to receive light such that less than the entire bar code symbol is detected at one time.

18. The bar code reader according to claim 13, wherein the means for selecting causes the detector elements to receive light such that the entire bar code symbol is detected at one time.

19. The bar code reader according to claim 13, further comprising a light source for emitting a light beam onto the bar code symbol.

20. The bar code reader according to claim 13, wherein the array of liquid crystal elements is disposed in a fixed relation with respect to the array of detector elements.

21. The bar code reader according to claim 13, wherein the detector elements are charge coupled devices.

22. A bar code reader for reading a bar code symbol, comprising:
- an array of detector elements;
- an array of selectable miniature mirror elements optically coupled to the array of detector elements, wherein the miniature mirror elements correspond to the detector elements;
- an array of focusing lenses disposed adjacent to the array of detector elements, wherein each focusing lens corresponds to at least one detector element; and
- means for selecting a miniature mirror element to cause at least one of the corresponding detector elements associated with the miniature mirror element to receive light reflected from the bar code symbol in focus.

23. A bar code reader for reading a bar code symbol according to claim 22, wherein said means for selecting selects based upon a distance between the symbol and the detector elements.

24. The bar code reader according to claim 22, wherein the array of focusing lenses is attached to the array of detector elements.

25. The bar code reader according to claim 22, wherein the means for selecting causes the detector elements to receive light such that less than the entire bar code symbol is detected at one time.

26. The bar code reader according to claim 22, wherein the means for selecting causes the detector elements to receive light such that the entire bar code symbol is detected at one time.

27. The bar code reader according to claim 22, further comprising a light source for emitting a light beam onto the bar code symbol.

28. The bar code reader according to claim 22, wherein the detector elements are charge coupled devices.

29. A method of reading a bar code symbol, comprising the steps of:
- spacing an array of detector elements from an array of selectable optical elements;
- disposing an array of focusing lenses adjacent to the detector array, each focusing lens corresponding to at least one detector element;
- selectively activating the optical elements, which correspond to the detector elements; and
- detecting light reflected from the bar code symbol, via the optical elements, at the corresponding detector elements, wherein the detected light is in focus.

30. The method of reading a bar code symbol according to claim 29, further comprising attaching the array of focusing lenses to the detector array.

31. The method according to claim 29, further comprising the step of emitting a light beam onto the bar code symbol.

32. The method according to claim 29, wherein the step of selectively activating the optical elements comprises the substep of selectively activating the optical elements to detect at one time less than the entire bar code symbol.

33. The method according to claim 29, wherein the step of selectively activating the optical elements comprises the substep of selectively activating the optical elements to detect at one time the entire bar code symbol.

34. The method according to claim 29, wherein the step of selectively activating the optical elements comprises the substep of selectively activating the optical elements such that the bar code symbol is read at a selected focal distance.

* * * * *

UNITED STATES PATENT AND TRADEMARK OFFICE
CERTIFICATE OF CORRECTION

PATENT NO. : 6,024,283
DATED : February 15, 2000
INVENTOR(S) : Joseph Campanelli et al.

It is certified that error appears in the above-identified patent and that said Letters Patent is hereby corrected as shown below:

Col. 8, line 10, change "FIG. 3" to -- FIG. 3C --; and

Col. 8, line 15, change "38" to -- 36 --.

Signed and Sealed this

Twenty-seventh Day of February, 2001

Attest:

NICHOLAS P. GODICI

*Attesting Officer*     *Acting Director of the United States Patent and Trademark Office*